United States Patent
Cheng et al.

(10) Patent No.: US 10,840,872 B2
(45) Date of Patent: Nov. 17, 2020

(54) LOW-PASS FILTER UTILIZING MUTUAL INDUCTANCE

(71) Applicant: QUALCOMM Incorporated, San Diego, CA (US)

(72) Inventors: Haitao Cheng, San Jose, CA (US); Yanming Xiao, San Diego, CA (US); Wu-Hsin Chen, San Diego, CA (US); Li Liu, San Diego, CA (US); Masoud Moslehi Bajestan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/275,574

(22) Filed: Feb. 14, 2019

(65) Prior Publication Data

US 2020/0266791 A1    Aug. 20, 2020

(51) Int. Cl.
*H03H 7/09* (2006.01)
*H03H 7/01* (2006.01)
*H04B 1/16* (2006.01)

(52) U.S. Cl.
CPC ........ *H03H 7/0115* (2013.01); *H03H 7/0153* (2013.01); *H03H 7/09* (2013.01); *H03H 2210/012* (2013.01); *H03H 2210/025* (2013.01); *H04B 1/16* (2013.01)

(58) Field of Classification Search
CPC . H03H 2001/0085; H03H 7/09; H03H 7/0115
USPC .................................................. 333/175, 185
See application file for complete search history.

(56) References Cited

U.S. PATENT DOCUMENTS

| | | | | | |
|---|---|---|---|---|---|
| 4,849,721 | A | * | 7/1989 | Matsuura | H03H 7/12 333/174 |
| 6,476,689 | B1 | * | 11/2002 | Uchida | H03H 1/0007 333/177 |
| 6,970,057 | B2 | * | 11/2005 | Lin | H03H 7/0123 333/177 |
| 2005/0219011 | A1 | * | 10/2005 | Lin | H03H 7/0123 333/185 |
| 2016/0359506 | A1 | * | 12/2016 | Ellae | H04B 1/0057 |

* cited by examiner

*Primary Examiner* — Rakesh B Patel
(74) *Attorney, Agent, or Firm* — Patterson & Sheridan, L.L.P.

(57) ABSTRACT

A low-pass filter having a notch frequency due to a resonance between a mutual inductance of inductive elements and a capacitance. An exemplary low-pass filter generally includes a first inductive element having a first terminal and a second terminal, the first terminal being coupled to the input port, and a second inductive element having a first terminal and a second terminal, the first terminal of the second inductive element being coupled to the second terminal of the first inductive element and the second terminal of the second inductive element being coupled to the output port. The filter also includes a shunt capacitive element coupled to the second terminal of the first inductive element, wherein a mutual inductance between the first inductive element and the second inductive element and a capacitance of the shunt capacitive element are configured to have a resonance providing a notch frequency for the low-pass filter.

17 Claims, 10 Drawing Sheets

LOW-PASS FILTER UTILIZING MUTUAL INDUCTANCE

BACKGROUND

Field of the Disclosure

Certain aspects of the present disclosure generally relate to electronic circuits and, more particularly, to a low-pass filter having a notch frequency due to a resonance between a mutual inductance of inductive elements and a capacitance.

Description of Related Art

Wireless communication networks are widely deployed to provide various communication services such as telephony, video, data, messaging, broadcasts, and so on. Such networks, which are usually multiple access networks, support communications for multiple users by sharing the available network resources. A wireless communication network may include a number of base stations that can support communication for a number of user equipments. A user equipment (UE) may communicate with a base station (BS) via a downlink and an uplink. The UE and/or BS may include a radio frequency front-end (RFFE) for transmitting and/or receiving radio frequency (RF) signals. The RFFE may include any of various suitable types of filters, such as high-pass filters, bandpass filter, and/or low-pass filters.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include an improved low-pass filter having a sharp notch frequency due to a resonance between a mutual inductance of two inductive elements and a capacitance.

Certain aspects of the present disclosure provide a low-pass filter. The low-pass-filter generally includes an input port and an output port. The low-pass filter also includes a first inductive element having a first terminal and a second terminal, the first terminal of the first inductive element being coupled to the input port, and a second inductive element having a first terminal and a second terminal, the first terminal of the second inductive element being coupled to the second terminal of the first inductive element and the second terminal of the second inductive element being coupled to the output port. The low-pass filter also includes a shunt capacitive element coupled to the second terminal of the first inductive element, wherein a mutual inductance between the first inductive element and the second inductive element and a capacitance of the shunt capacitive element are configured to have a resonance providing a notch frequency for the low-pass filter.

Certain aspects of the present disclosure provide a radio frequency front-end circuit comprising a low-pass filter as described herein.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
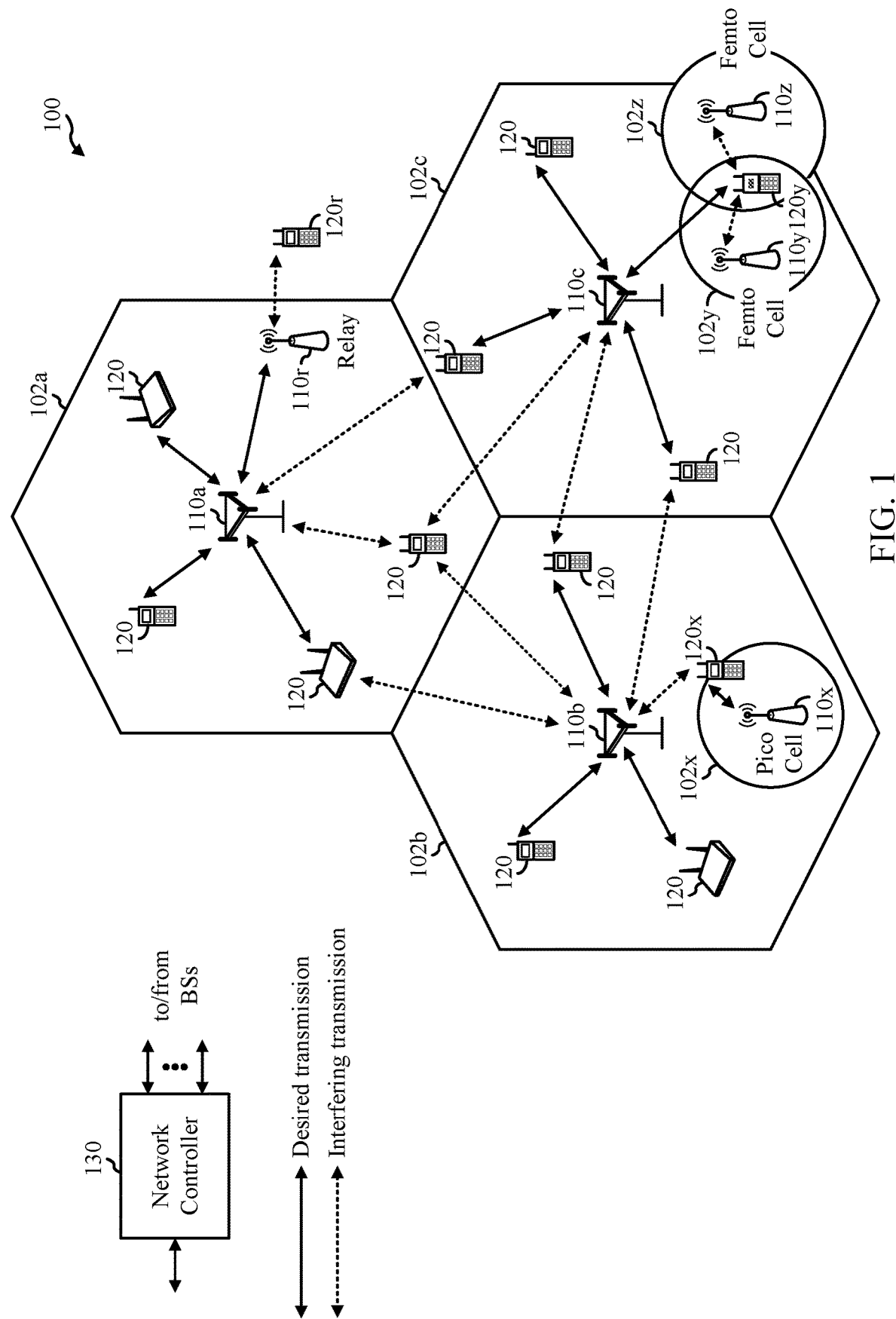
FIG. 1 is a block diagram conceptually illustrating an example telecommunications system, in accordance with certain aspects of the present disclosure.

Aspects of the present disclosure provide a low-pass filter having a notch frequency due to a resonance between a mutual inductance of inductive elements and a capacitance.

This notch frequency helps the low-pass filter have a steeper rejection than the components of the low-pass filter would otherwise have.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

NR access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

Example Wireless Communication System

FIG. 1 illustrates an example wireless communication network 100 in which aspects of the present disclosure may be performed. For example, the wireless communication network 100 may be a New Radio (NR) or 5G network. Wireless devices in the wireless network 100 may be equipped with a low-pass filter, described herein, that has a notch frequency due to a resonance between a mutual inductance of inductive elements and a capacitance.

As illustrated in FIG. 1, the wireless network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B (NB) and/or a Node B subsystem serving this coverage area, depending on the context in which the term is used. In NR systems, the term "cell" and next generation Node B (gNB), new radio base station (NR BS), 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A base station (BS) may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, a macro BS may have a high transmit power level (e.g., 20 watts (W)) whereas a pico BS, a femto BS, and relays may have a lower transmit power level (e.g., 1 W).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless network 100, and each UE may be stationary or mobile. A UE may also be referred to as a mobile station (MS), a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a Global Positioning System (GPS) device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz, and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for a system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for a system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a cyclic prefix (CP) on the uplink and downlink and include support for half-duplex operation using time-division duplexing (TDD). Beamforming may be supported, and beam direction may be dynamically configured. Multiple-input, multiple-output (MIMO) transmissions with precoding may also be supported. MIMO configurations in the downlink (DL) may support up to 8 transmit antennas with multi-layer DL transmissions up to 8 streams and up to 2 streams per UE. Aggregation of multiple cells may be supported with up to 8 serving cells.

In some examples, access to the air interface may be scheduled, wherein a scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
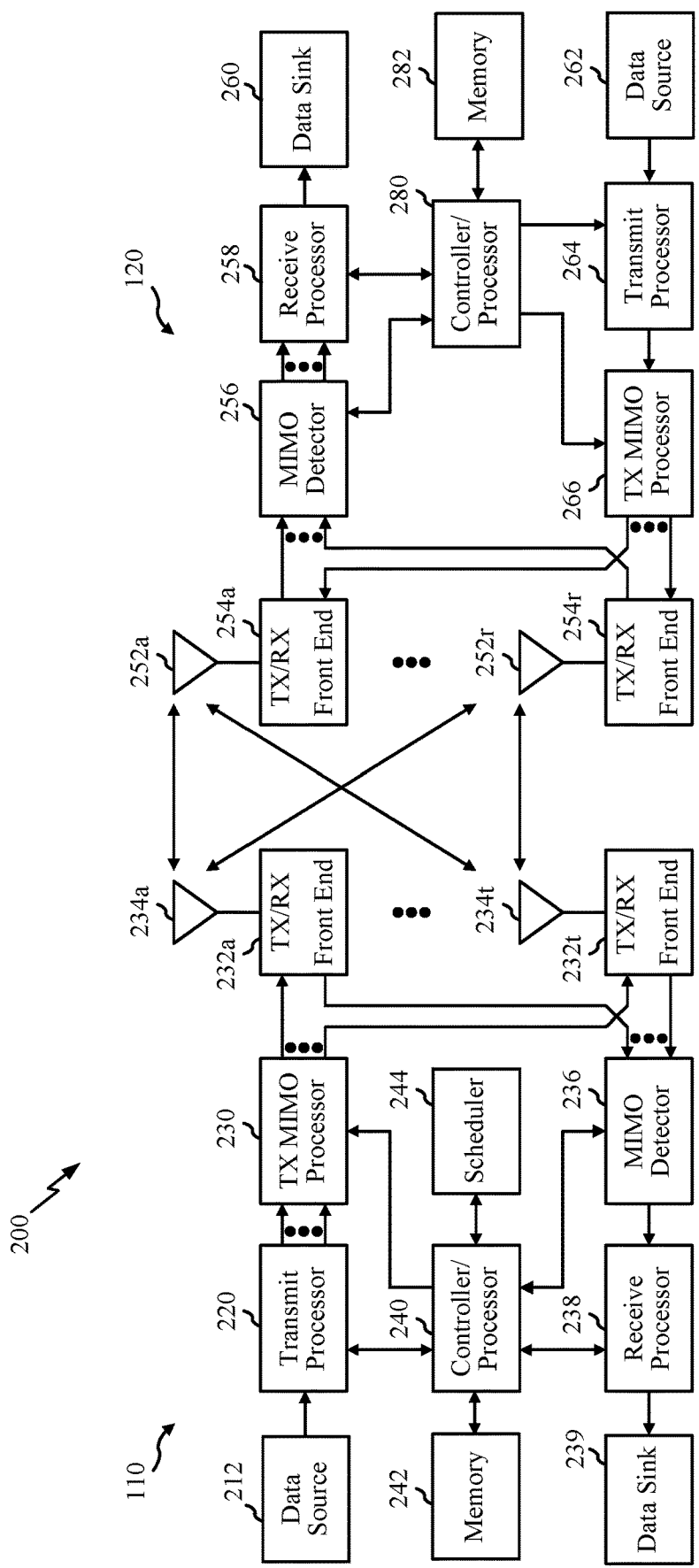
FIG. 2 is a block diagram conceptually illustrating a design of an example base station (BS) and an example user equipment (UE), in accordance with certain aspects of the present disclosure.

FIG. 2 illustrates example components of BS 110 and UE 120 (as depicted in FIG. 1), which may be used to implement aspects of the present disclosure. For example, the TX/RX front-end circuits 232, 254, as further described herein, may include a low-pass filter having a notch frequency due to a resonance between a mutual inductance of inductive elements and a capacitance.

At the BS 110, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 220 may process (e.g., encode and symbol map) the data and control information to obtain data symbols and control symbols, respectively. The processor 220 may also generate reference symbols, e.g., for the primary synchronization signal (PSS), secondary synchronization signal (SSS), and cell-specific reference signal (CRS). A transmit (TX) multiple-input multiple-output (MIMO) processor 230 may perform spatial processing (e.g., precoding) on the data symbols, the control symbols, and/or the reference symbols, if applicable, and may provide output symbol streams to the transmit (TX) front-end circuits 232a through 232t. Each TX front-end circuit 232 may process a respective output symbol stream (e.g., for OFDM, etc.) to obtain an output sample stream. Each TX front-end circuit may further process (e.g., convert to analog, amplify, filter, and upconvert) the output sample stream to obtain a downlink signal. Downlink signals from TX front-end circuits 232a through 232t may be transmitted via the antennas 234a through 234t, respectively.

At the UE 120, the antennas 252a through 252r may receive the downlink signals from the BS 110 and may provide received signals to the receive (RX) front-end circuits 254a through 254r, respectively. Each RX front-end circuit 254 may condition (e.g., filter, amplify, downconvert, and digitize) a respective received signal to obtain input samples. Each RX front-end circuit may further process the input samples (e.g., for OFDM, etc.) to obtain received symbols. A MIMO detector 256 may obtain received symbols from all the RX front-end circuits 254a through 254r, perform MIMO detection on the received symbols if applicable, and provide detected symbols. A receive processor 258 may process (e.g., demodulate, deinterleave, and decode) the detected symbols, provide decoded data for the UE 120 to a data sink 260, and provide decoded control information to a controller/processor 280.

On the uplink, at UE 120, a transmit processor 264 may receive and process data (e.g., for the physical uplink shared channel (PUSCH)) from a data source 262 and control information (e.g., for the physical uplink control channel (PUCCH) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the RX front-end circuits 254a through 254r (e.g., for SC-FDM, etc.), and transmitted to the BS 110. At the BS 110, the uplink signals from the UE 120 may be received by the antennas 234, processed by the TX front-end circuits 232, detected by a MIMO detector 236 if applicable, and further processed by a receive processor 238 to obtain decoded data and control information sent by the UE 120. The receive processor 238 may provide the decoded data to a data sink 239 and the decoded control information to the controller/processor 240.

The controllers/processors 240 and 280 may direct the operation at the BS 110 and the UE 120, respectively. The processor 240 and/or other processors and modules at the BS 110 may perform or direct the execution of processes for the techniques described herein. The memories 242 and 282 may store data and program codes for BS 110 and UE 120, respectively. A scheduler 244 may schedule UEs for data transmission on the downlink and/or uplink. In certain aspects, the TX/RX front-end circuits 232, 254 may include the low-pass filter as further described herein.

Figure 3:
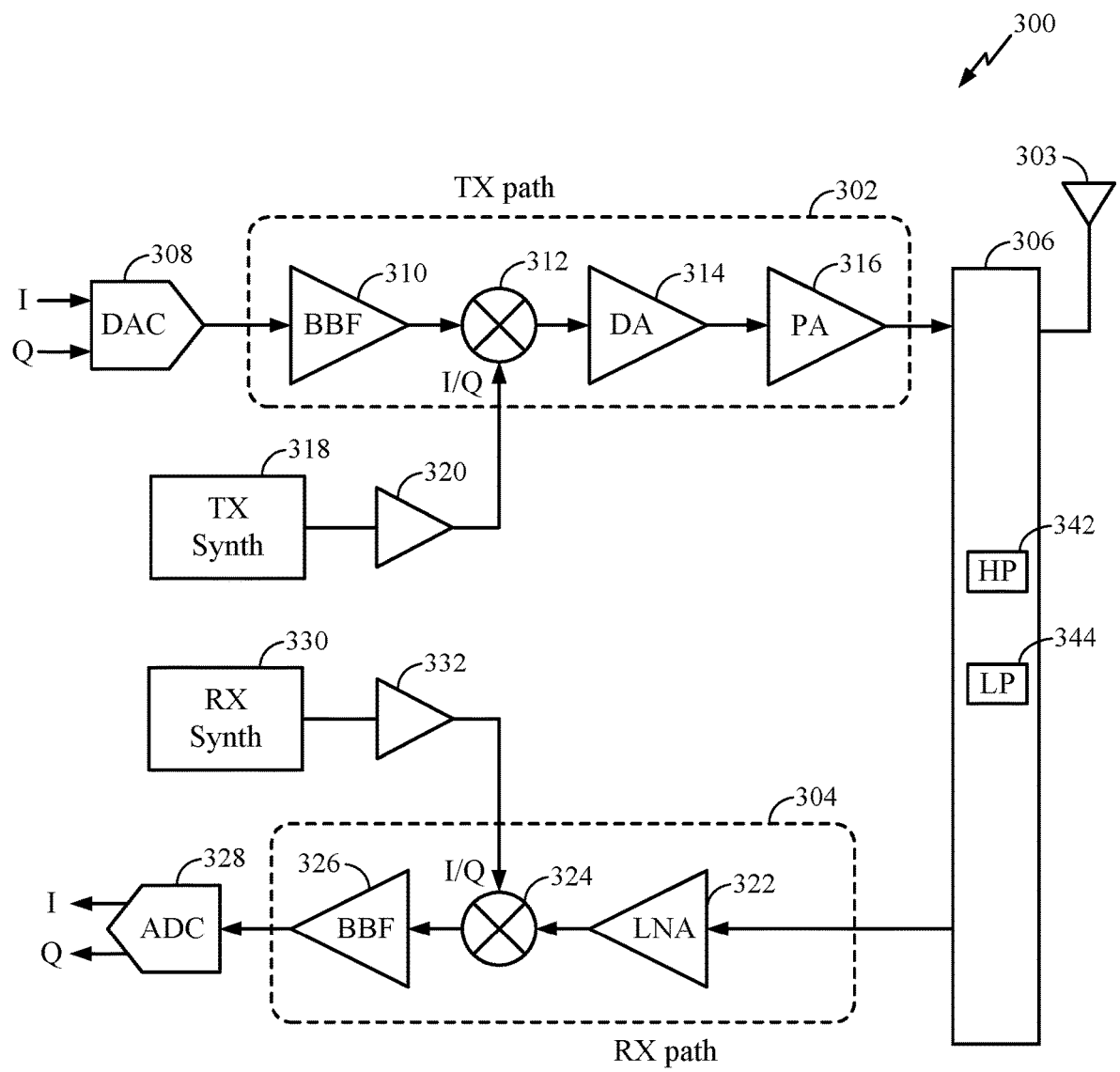
FIG. 3 is a block diagram showing an example transceiver front-end, in accordance with certain aspects of the present disclosure.

FIG. 3 is a block diagram of an example transceiver front-end 300, such as TX/RX front-end circuits 232, 254 in FIG. 2, in which aspects of the present disclosure may be practiced. The transceiver front-end 300 includes at least one transmit (TX) path 302 (also known as a transmit chain) for transmitting signals via one or more antennas and at least one receive (RX) path 304 (also known as a receive chain) for receiving signals via the antennas. When the TX path 302 and the RX path 304 share an antenna 303, the paths may be connected with the antenna via an interface 306.

The interface 306 may include any of various suitable RF devices, such as a duplexer, a switch, a diplexer, and the like. The interface 306 may include a high-pass filter 342 and/or a low-pass filter 344, as further described herein. The low-pass filter 344, as further described herein, may be configured to have a notch frequency due to a resonance between a capacitance of a capacitive element and a mutual inductance of inductive elements composing the low-pass filter.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be included in the RFIC or external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 may include a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltagecontrolled oscillator (VCO) to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects described herein may be used for low-pass filtering in any of various other suitable systems.

Example Low-Pass Filter

As wireless devices shrink in size, radio frequency integrated circuits (RFICs), such as the transceiver front-end 300 depicted in FIG. 3, may use various low-pass filters to reject high frequencies. A low-pass filter having an inductor-capacitor-inductor (L-C-L) structure (also referred to as a "T filter" due to the filter's topology in schematic diagrams) may provide a filter with a reduced area, but due to the limitation of only having three components providing a second order response, the roll-off slope between the passband and stopband may not be sharp enough for certain wireless communications applications or standards. Certain aspects of the present disclosure provide a L-C-L low-pass filter that introduces a notch in the frequency response to sharpen the roll-off between the passband and stopband by utilizing the resonance between the filter capacitance and the mutual inductance of the inductive elements in the filter. The resonance between the filter capacitance and the mutual inductance of the inductive elements described herein may also be applied to higher-order ladder topologies of the L-C-L low-pass filter, such as an L-C-L-C filter, L-C-L-C-L filter, L-C-L-C-L-C-L filter, etc.

Figure 4B:
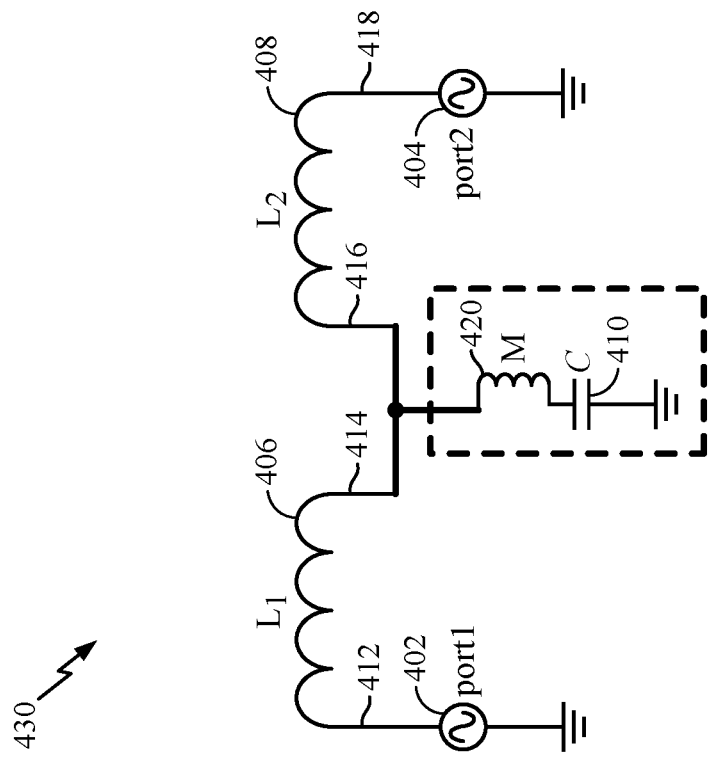
FIG. 4B illustrates a schematic view of an equivalent circuit for the example low-pass filter of FIG. 4A, in accordance with certain aspects of the present disclosure.
Figure 4A:
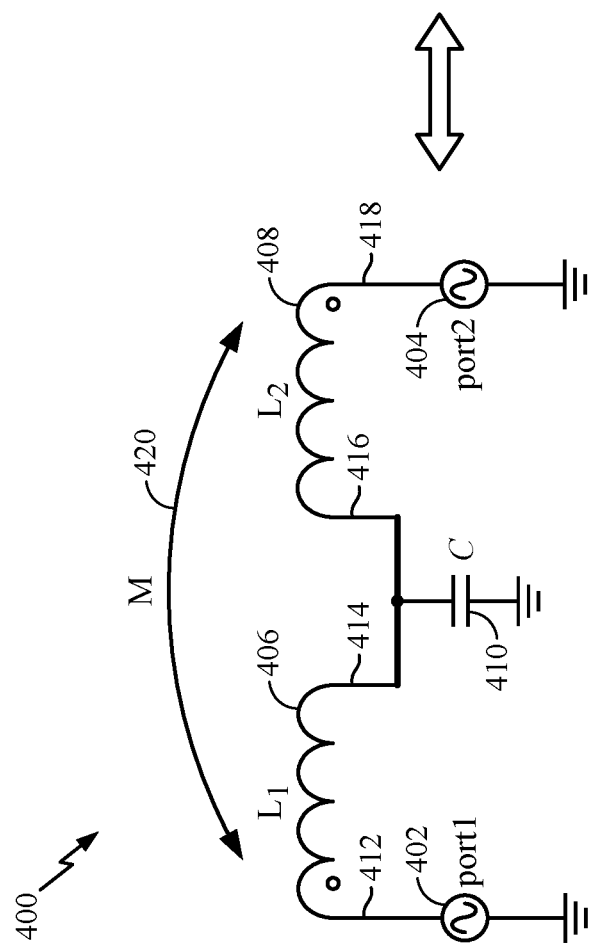
FIG. 4A illustrates a schematic view of an example low-pass filter having a resonance providing a notch frequency via a resonance between a mutual inductance and a capacitance, in accordance with certain aspects of the present disclosure.
Figure 6:
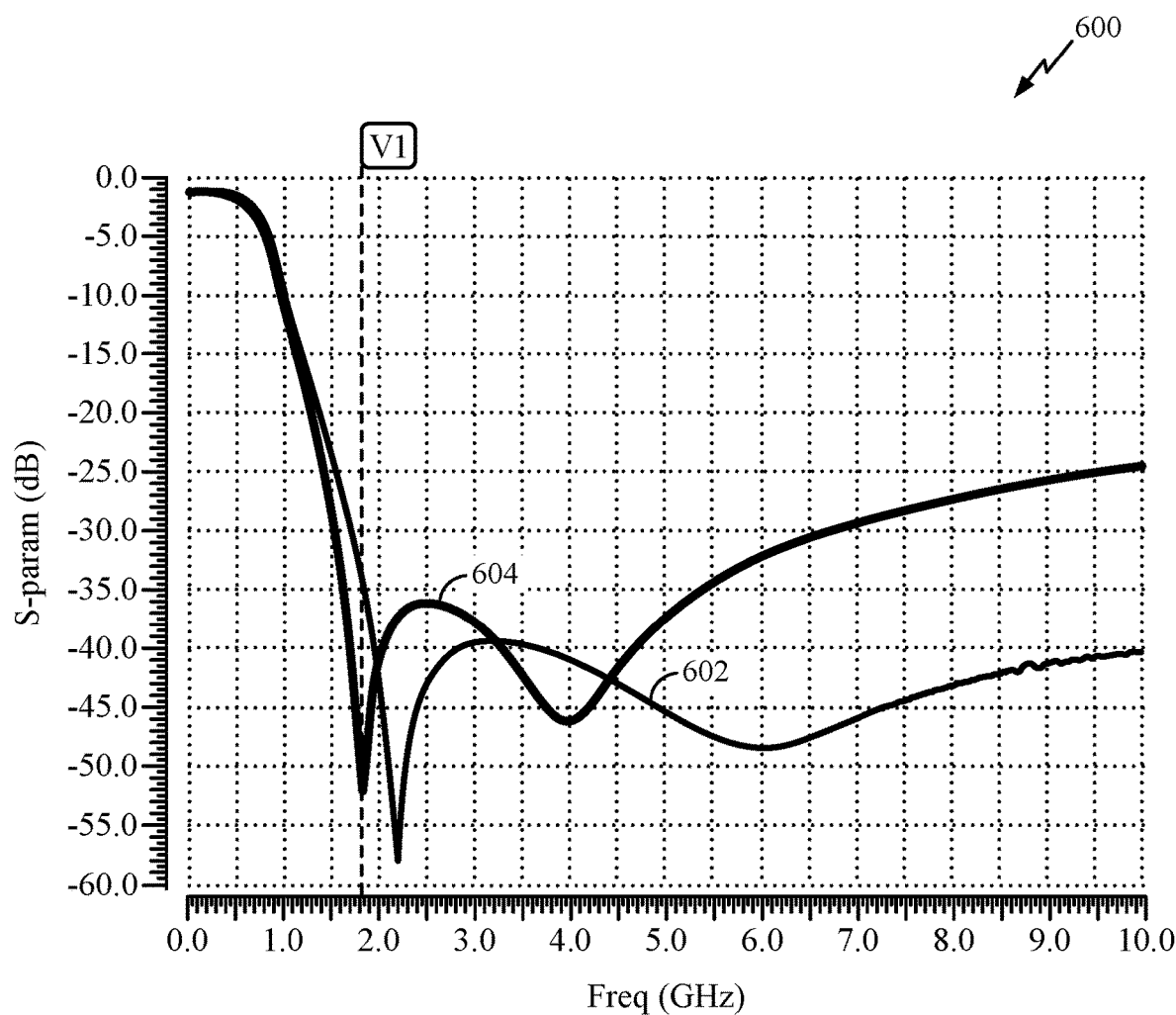
FIG. 6 illustrates an example graph of frequency responses for the low-pass filters of FIGS. 5A and 5B, in accordance with certain aspects of the present disclosure.

FIG. 4A illustrates a schematic view of an example low-pass filter 400 having a resonance providing a notch frequency via a resonance between a mutual inductance and a capacitance, in accordance with certain aspects of the present disclosure. As shown, the low-pass filter 400 may include an input port 402, an output port 404, a first inductive element 406 ($L_1$), a second inductive element 408 ($L_2$), and a shunt capacitive element 410. A mutual inductance 420 between the first inductive element 406 and the second inductive element 408 in combination with a capacitance of the shunt capacitive element 410 may generate a resonance providing a notch frequency for the low-pass filter 400, as further described herein (e.g., as depicted in FIG. 6). In certain aspects, the mutual inductance 420 may be configured to provide a resonance that leads to a notch with a frequency response having a sharp roll-off as further described herein. The notch frequency may be lower than a nominal cut-off frequency of the low-pass filter without considering the mutual inductance (e.g., a low-pass filter that does not have a resonance between the mutual inductance and capacitance). In certain aspects, the resonance generated from the mutual inductance 420 in combination with a capacitance of the shunt capacitive element 410 may be applied to higher order ladder topologies of the low-pass filter 400, such as an L-C-L-C filter, L-C-L-C-L filter, L-C-L-C-L-C-L filter, etc.

The first inductive element 406 and the second inductive element 408 may be coil inductors as further described herein. The first inductive element 406 may have a first terminal 412 and a second terminal 414. As shown, the first terminal 412 of the first inductive element 406 may be coupled to the input port 402. The second inductive element 408 may have a first terminal 416 and a second terminal 418, where the first terminal 416 of the second inductive element 408 may be coupled to the second terminal 414 of the first inductive element 406, and the second terminal 418 of the second inductive element 408 may be coupled to the output port 404.

FIG. 4B illustrates a schematic view of an equivalent circuit 430 for the example low-pass filter 400, where the mutual inductance 420 effectively behaves as another inductive element (M) connected in series with the capacitive element 410 to exhibit a resonance, in accordance with certain aspects of the present disclosure. This resonance may be utilized to provide a notch in the frequency response of the low-pass filter 400.

Figure 4C:
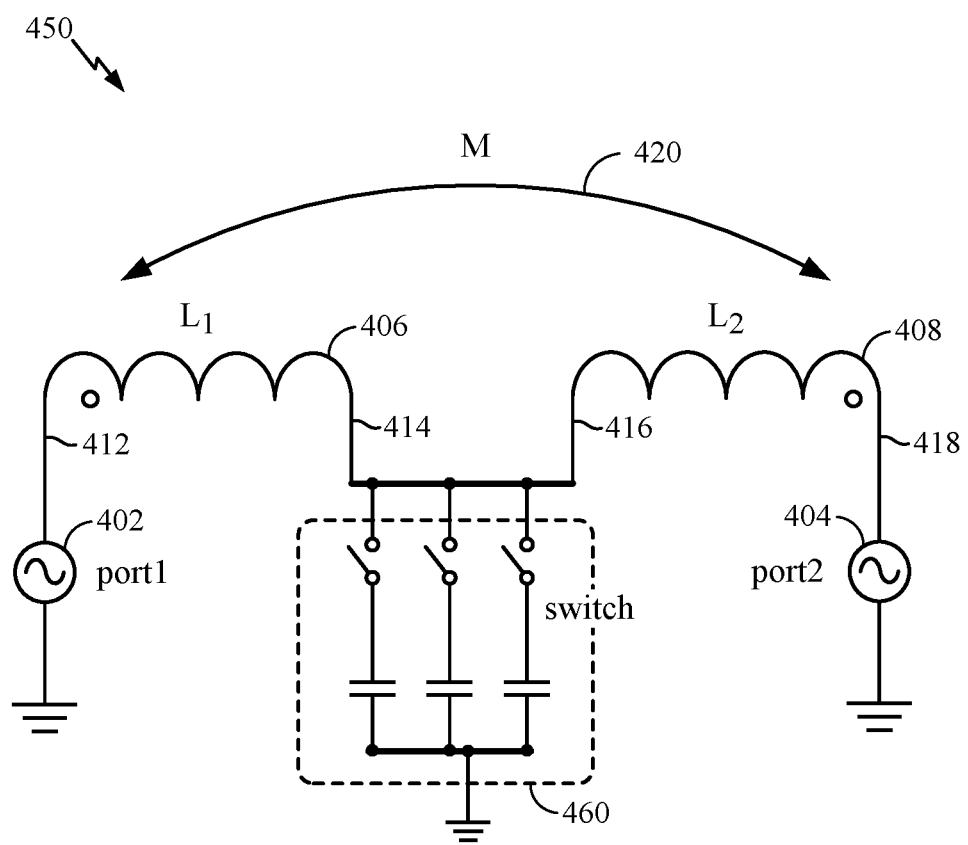
FIG. 4C illustrates a schematic view of the example low-pass filter of FIG. 4A including a tunable capacitive element, in accordance with certain aspects of the present disclosure.

The shunt capacitive element 410 may be a capacitor. As an example, the shunt capacitive element 410 may include at least one of a metal-oxide-metal (MOM) capacitor, a metal-insulator-metal (MIM) capacitor, or a metal-oxide-semiconductor (MOS) capacitor. In certain aspects, the capacitive element 410 may be implemented with a tunable capacitor or a tunable capacitive array. By using a tunable capacitance, the notch frequency of the low-pass filter can be adjusted. For example, FIG. 4C illustrates a schematic view of an example low-pass filter 450 including a tunable capacitive array 460 comprising a network of switched capacitors selectively coupled in parallel, in accordance with certain aspects of the present disclosure. For example, the capacitive array may be a binary-weighted capacitive array. A binary-weighted capacitive array includes an array of capacitors arranged in parallel branches, each branch having a binary-weighted capacitance value (e.g., $C \times 2^0$, $C \times 2^1$, $C \times 2^2$, . . . ) and selected via a switch coupled to each branch.

Figure 5A:
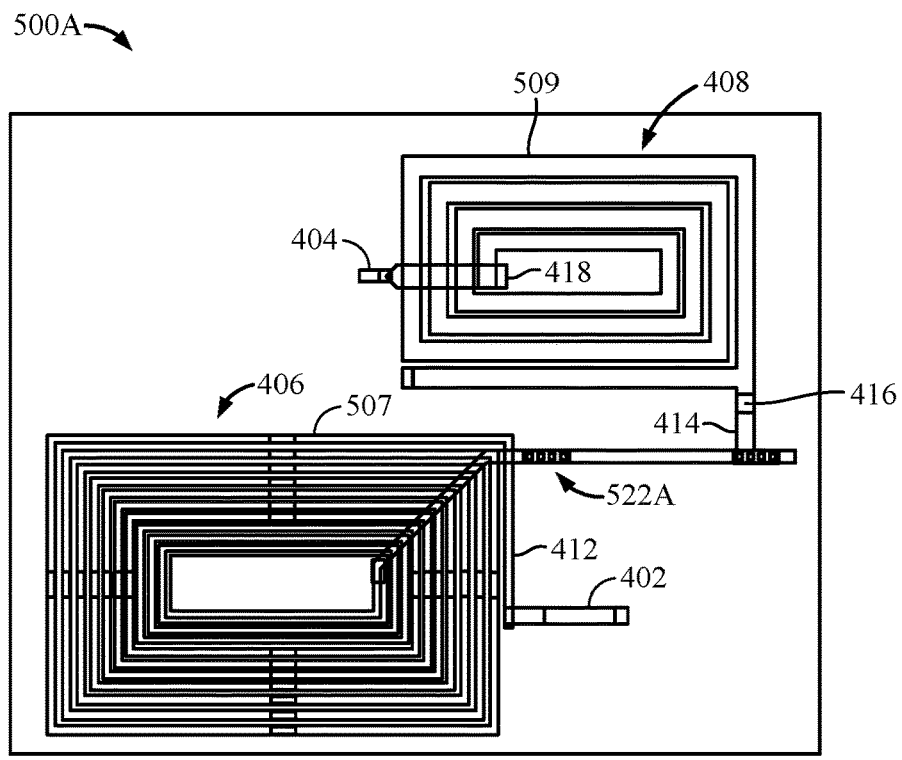
FIG. 5A illustrates a top-view of a multi-layered layout of an example low-pass filter, in accordance with certain aspects of the present disclosure.

FIG. 5A illustrates a top-view of a multi-layered layout of an example low-pass filter 500A, in accordance with certain aspects of the present disclosure. As shown, the first inductive element 406 and the second inductive element 408 are inductor coils that may be disposed on the same or different layers of an integrated circuit. The first inductive element 406 is disposed adjacent to and along a side of the second inductive element 408.

In certain aspects, a portion of the first inductive element 406 may overlap with a portion of the second inductive element 408. For example, the first inductive element 406 may be disposed on a layer above or below the second inductive element 408, such that the first inductive element 406 may be arranged to overlap with a portion of the second inductive element 408.

The inductive elements 406, 408 may be implemented in the layout as spirals wound in the same direction (e.g., both in a clockwise direction or both in a counter-clockwise direction), which may enable the total magnetic field to be reduced and the total inductance between the input port 402 and output port 404 to be smaller than the sum of the inductances of the inductive elements 406, 408. For example, as shown in FIG. 5A, the first inductive element 406 may include a first spiral 507 wound in a counter-clockwise direction, and the second inductive element 408 may include a second spiral 509 also wound in a counter-clockwise direction. In other aspects, the first inductive element 406 may include a first spiral wound in a clockwise direction, and the second inductive element 408 may include a second spiral likewise wound in a clockwise direction.

The second terminal 414 of the first inductive element 406 may include a conductor segment 522A coupled to the shunt capacitive element 410 (not shown) and the first terminal 416 of the second inductive element 408. The mutual inductance between the inductive elements 406, 408 may produce a resonance along the conductor segment 522A with the shunt capacitive element 410 (not shown). The conductor segment 522A may be a portion of a conductive trace and/or via. Although the shunt capacitive element 410 is not shown in this example layout, a terminal of the shunt capacitive element 410 may be coupled to the second terminal 414 of the first inductive element 406. The shunt capacitive element 410 may be disposed inside, below, or above one of the inductive elements 406, 408 to reduce chip area.

In certain aspects, the mutual inductance may be configured based on a distance between the first inductive element 406 and second inductive element 408. In this example, the mutual inductance may be relatively smaller due to the greater distance between the first inductive element 406 and second inductive element 408, compared to that of FIG. 5B.

Figure 5B:
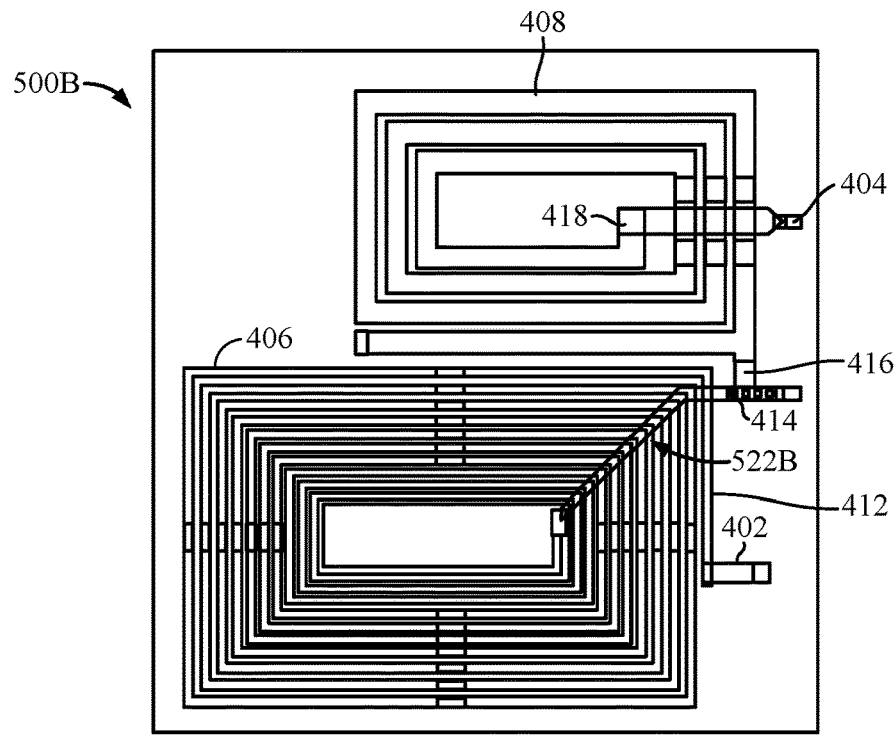
FIG. 5B illustrates a top-view of a multi-layered layout of another example low-pass filter, in accordance with certain aspects of the present disclosure.

FIG. 5B illustrates a top-view of a multi-layered layout of another example low-pass filter 500B, in accordance with certain aspects of the present disclosure. As shown, the first inductive element 406 is positioned closer to the second inductive element 408 than in FIG. 5A, resulting in a relatively larger mutual inductance, which in turn may affect the notch produced by the resonance between the mutual inductance and the shunt capacitive element 410 (not shown). The second terminal 414 of the first inductive element 406 includes a conductor segment 522B coupled to the shunt capacitive element 410 and the first terminal 416 of the inductive element 408. The conductor segment 522B may be disposed on a layer above or below the spiral of the first inductive element 406. The mutual inductance between the inductive elements 406, 408 may produce the resonance along the conductor segment 522B with the shunt capacitive element 410 (not shown). In certain aspects, the shunt capacitive element 410 may be disposed inside, below, or above the inductive elements 406 or 408 to reduce the chip area of the low pass filter.

FIG. 6 illustrates an example graph 600 of frequency responses for the low-pass filters 500A, 500B, in accordance with certain aspects of the present disclosure. As shown, curves 602 and 604 are transfer functions of the low-pass filters, illustrating the magnitude of the output signal of the low-pass filter in decibels (dB) as a function of frequency in GHz. The curve 602 corresponds to the frequency response of low-pass filter 500A, whereas the curve 604 corresponds to the frequency response of low-pass filter 500B. As shown, the notch frequency in the curve 602 due to the resonance from the mutual inductance is greater than the notch frequency in the curve 604, but the curve 604 has a steeper roll-off than the curve 602. The curves 602 and 604 demonstrate that a greater mutual inductance (e.g., the mutual inductance exhibited by the low-pass filter 500B) may reduce the notch frequency and increase the roll-off slope of the low-pass filter, thereby enabling an L-C-L filter to satisfy stopband criteria for certain wireless communication applications.

Figure 7A:
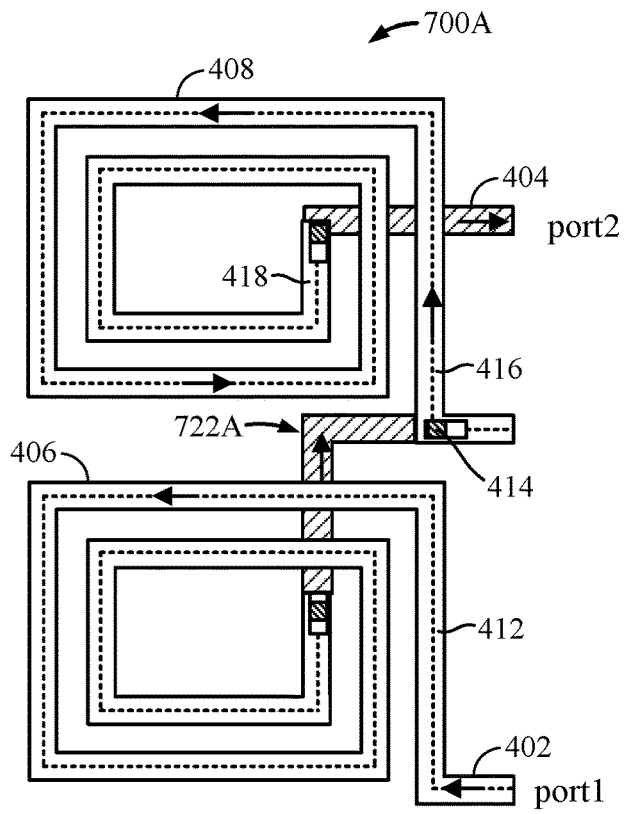
FIG. 7A illustrates a top-view of a multi-layered layout of an example low-pass filter, in accordance with certain aspects of the present disclosure.

FIG. 7A illustrates a top-view of a multi-layered layout of an example low-pass filter 700A, in accordance with certain aspects of the present disclosure. In this example, the spiral of the second inductive element 408 is wound counter-clockwise from the first terminal 416, beginning from an outer portion of the second inductive element 408 to an inner portion of the second inductive element 408. As shown, a conductive segment 722A is disposed below the inductive element 406 and couples to the first terminal 416 of the second inductive element 408 at an outer portion of the inductor spiral. The conductive segment 722A may bend to meet the first terminal 416 of the second inductive element 408. The capacitive element 410 (not shown) may be disposed outside of the inductor spiral of the second inductive element 408. In certain aspects, the shunt capacitive element 410 may be disposed inside, below, or above the inductive element 406 or 408 to reduce the chip area of the low-pass filter.

Figure 7B:
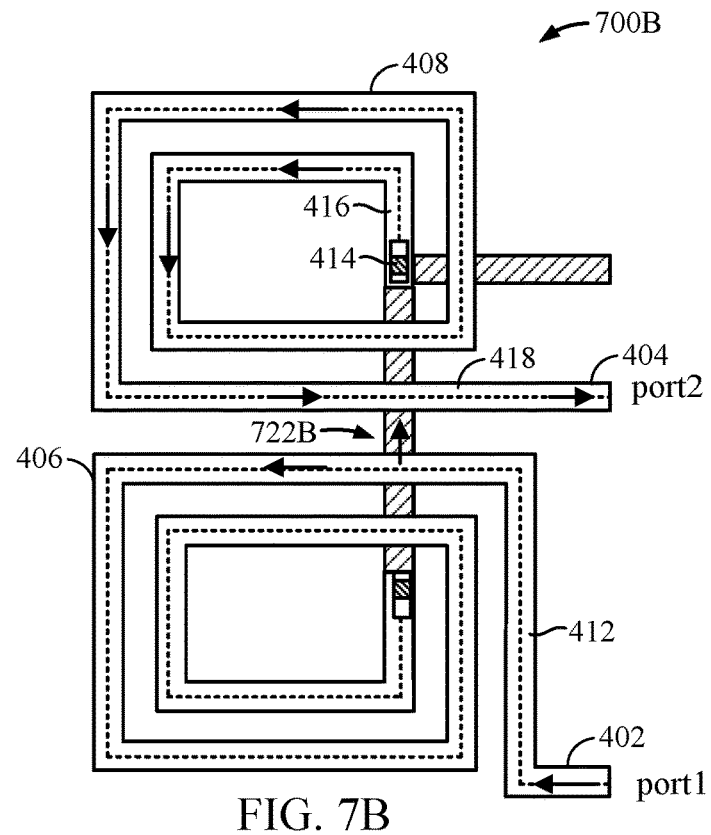
FIG. 7B illustrates a top-view of a multi-layered layout of another example low-pass filter, in accordance with certain aspects of the present disclosure.

FIG. 7B illustrates a top-view of a multi-layered layout of another example low-pass filter 700B, in accordance with certain aspects of the present disclosure. In this example, the spiral of the second inductive element 408 is would counter-clockwise from the first terminal 416 disposed in an inner portion of the second inductive element. As shown, a conductive segment 722B is disposed below the first inductive element 406 and second inductive element 408. The conductive segment 722B couples to the first terminal 416 of the second inductive element 408 at an inner portion of the inductor spiral. The conductive segment 722B may be run in a straight line from the first inductive element 406 to the first terminal 416 of the second inductive element 408. The shunt capacitive element 410 (not shown) may be disposed inside of the inductor spiral of the second inductive element 408. In certain aspects, the shunt capacitive element 410 may be disposed inside, below, or above the inductive element 406 or 408 to save chip area. FIGS. 7A and 7B illustrate two example topologies of low-pass filters 700A, 700B to realize inductive elements 406, 408 in both counter-clockwise directions. In certain aspects, the inductive elements 406, 408 may be realized in both clockwise directions.

Figure 8:
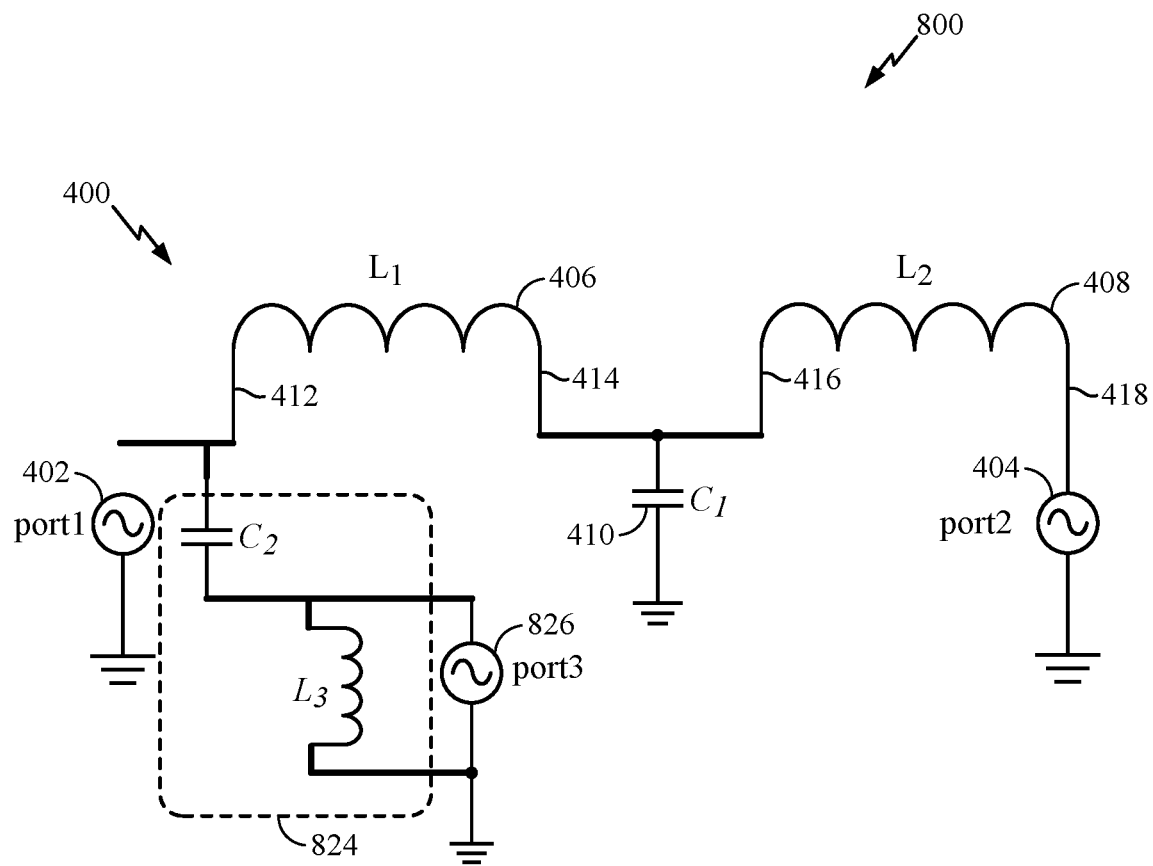
FIG. 8 illustrates a schematic view of an example diplexer, in accordance with certain aspects of the present disclosure.

In certain aspects, the low-pass filter may be part of a diplexer. For example, FIG. 8 illustrates a schematic view of an example diplexer 800, in accordance with certain aspects of the present disclosure. As shown, the diplexer 800 may include the low-pass filter 400, a high-pass filter 824, and a high-pass output port 826. The high-pass filter 824 may be implemented by a series capacitive element ($C_2$) coupled to a shunt inductive element ($L_3$). The input port 402 may be a shared input terminal for the low-pass filter 400 and for the high-pass filter 824. The high-pass output port 826 functions as an output terminal of the high-pass filter 824.

Figure 9:
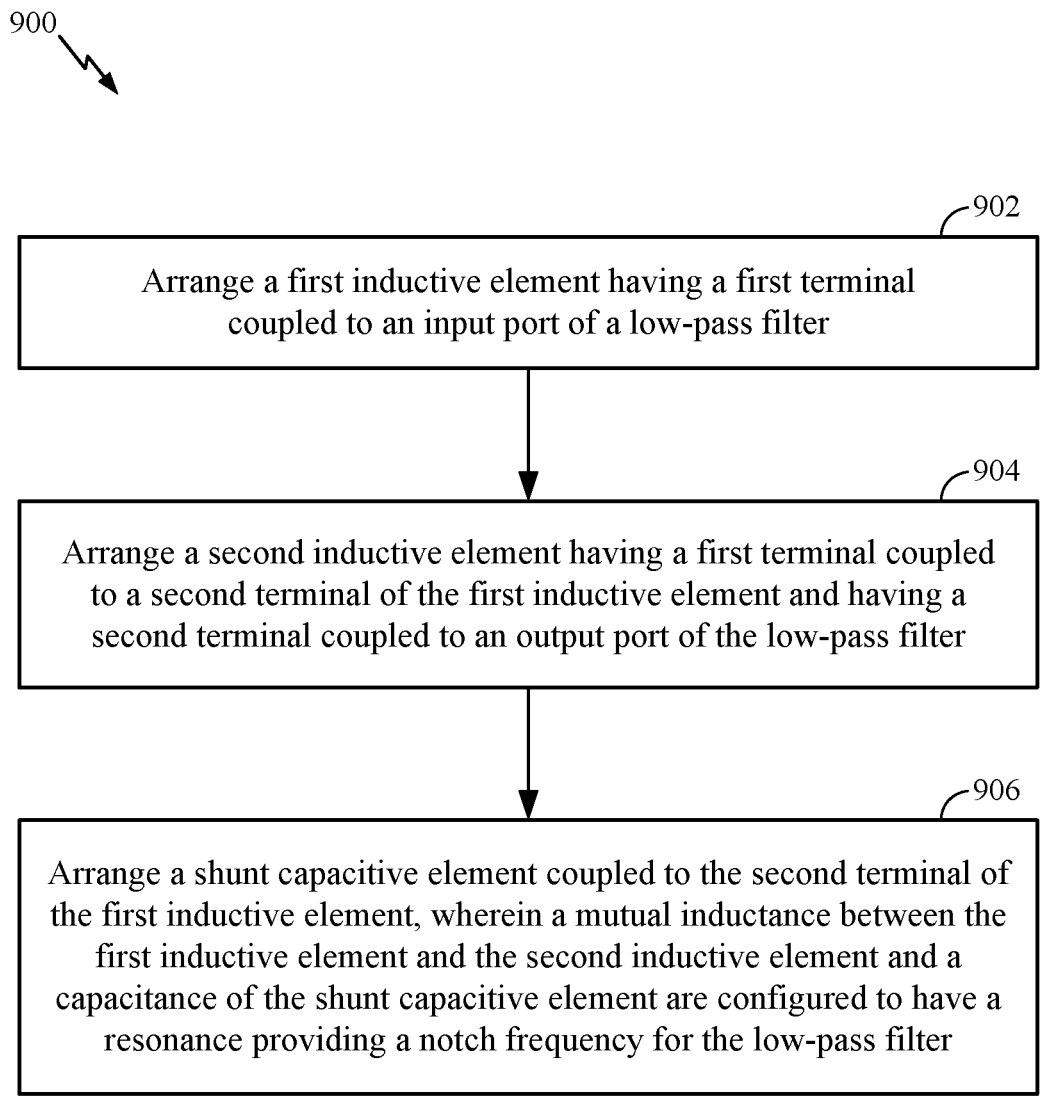
FIG. 9 is a flow diagram illustrating example operations for fabricating a physical layout of a low-pass filter, in accordance with certain aspects of the present disclosure.

FIG. 9 is a flow diagram illustrating example operations 900 for fabricating a physical layout of a low-pass filter, in accordance with certain aspects of the present disclosure. The operations 900 may be performed by a semiconductor processing chamber, for example.

At block 902, the chamber may arrange a first inductive element (e.g., the first inductive element 406 depicted in FIG. 4) having a first terminal coupled to an input port of the low-pass filter. At block 904, the chamber may arrange a second inductive element (e.g., the second inductive element 408 depicted in FIG. 4) having a first terminal coupled to a second terminal of the first inductive element and having a second terminal coupled to an output port of the low-pass filter. At block 906, the chamber may arrange a shunt capacitive element coupled to the second terminal of the first inductive element. A mutual inductance between the first inductive element and the second inductive element and a capacitance of the shunt capacitive element are configured to have a resonance providing a notch frequency for the low-pass filter.

It should be appreciated that the low-pass filter described herein may enable an RFIC to use an L-C-L low-pass filter that facilitates a reduced area and component count, while providing a sharp roll-off from the passband to the stopband.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A low-pass filter comprising:
   an input port;
   an output port;
   a first inductive element having a first terminal and a second terminal, the first terminal of the first inductive element being coupled to the input port;
   a second inductive element having a first terminal and a second terminal, the first terminal of the second inductive element being coupled to the second terminal of the first inductive element and the second terminal of the second inductive element being coupled to the output port; and
   a shunt capacitive element coupled to the second terminal of the first inductive element and comprising an array of switched capacitors, wherein a mutual inductance between the first inductive element and the second inductive element and a capacitance of the shunt capacitive element are configured to have a resonance providing a notch frequency for the low-pass filter.

2. The filter of claim 1, wherein the notch frequency is lower than a nominal cut-off frequency of the low-pass filter without considering the mutual inductance.

3. The filter of claim 1, wherein the mutual inductance is configured based on a distance between the first inductive element and the second inductive element.

4. The filter of claim 1, wherein the first inductive element is disposed adjacent to and along a side of the second inductive element.

5. The filter of claim 1, wherein a portion of the first inductive element overlaps with a portion of the second inductive element.

6. The filter of claim 1, wherein the first inductive element comprises a first spiral wound in a clockwise direction, and the second inductive element comprises a second spiral wound in a clockwise direction.

7. The filter of claim 1, wherein the first inductive element comprises a first spiral wound in a counter-clockwise direction, and the second inductive element comprises a second spiral wound in a counter-clockwise direction.

8. The filter of claim 1, wherein the array of switched capacitors forms a tunable capacitive array.

9. A radio frequency front-end circuit comprising a low-pass filter, the low-pass filter comprising:
   an input port;
   an output port;
   a first inductive element having a first terminal and a second terminal, the first terminal of the first inductive element being coupled to the input port;
   a second inductive element having a first terminal and a second terminal, the first terminal of the second inductive element being coupled to the second terminal of the first inductive element and the second terminal of the second inductive element being coupled to the output port; and
   a shunt capacitive element coupled to the second terminal of the first inductive element and comprising an array of switched capacitors, wherein a mutual inductance between the first inductive element and the second inductive element and a capacitance of the shunt capacitive element are configured to have a resonance providing a notch frequency for the low-pass filter.

10. The circuit of claim 9, wherein the low-pass filter is a part of a diplexer, the diplexer further comprising a high-pass filter coupled to the low-pass filter.

11. The circuit of claim 9, wherein the array of switched capacitors forms a tunable capacitive array.

12. The circuit of claim 9, wherein the mutual inductance is configured based on a distance between the first inductive element and the second inductive element.

13. The circuit of claim 9, wherein the notch frequency is lower than a nominal cut-off frequency of the low-pass filter without considering the mutual inductance.

14. The circuit of claim 9, wherein the first inductive element is disposed adjacent to and along a side of the second inductive element.

15. The circuit of claim 9, wherein a portion of the first inductive element overlaps with a portion of the second inductive element.

16. The circuit of claim 9, wherein the first inductive element comprises a first spiral wound in a clockwise direction, and the second inductive element comprises a second spiral wound in a clockwise direction.

17. The circuit of claim 9, wherein the first inductive element comprises a first spiral wound in a counter-clockwise direction, and the second inductive element comprises a second spiral wound in a counter-clockwise direction.

* * * * *